United States Patent
Sung et al.

(10) Patent No.: US 7,948,161 B2
(45) Date of Patent: May 24, 2011

(54) DISPLAY DEVICE

(75) Inventors: Si-Duk Sung, Seoul (KR); Byung-Sik Koh, Gwangmyeong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/719,386

(22) Filed: Mar. 8, 2010

(65) Prior Publication Data

US 2010/0164363 A1   Jul. 1, 2010

Related U.S. Application Data

(63) Continuation of application No. 11/755,412, filed on May 30, 2007, now Pat. No. 7,692,372.

(30) Foreign Application Priority Data

Jun. 1, 2006 (KR) .................. 10-2006-0049548

(51) Int. Cl.
*H01J 1/62* (2006.01)
(52) U.S. Cl. .................. 313/498; 313/506; 313/512
(58) Field of Classification Search .................. 313/506, 313/498, 505, 509, 512
See application file for complete search history.

(56) References Cited

U.S. PATENT DOCUMENTS

| 4,862,153 | A | 8/1989 | Nakatani et al. |
| 6,160,349 | A | 12/2000 | Nagai |
| 2005/0184652 | A1 | 8/2005 | Maruyama et al. |
| 2005/0200291 | A1 | 9/2005 | Naugler, Jr. |

FOREIGN PATENT DOCUMENTS

| CN | 1371019 | 9/2002 |
| JP | 2003-167523 | 6/2003 |
| JP | 2004-152500 | 5/2004 |
| JP | 2004-271819 | 9/2004 |
| JP | 2004-354505 | 12/2004 |
| JP | 2005-062627 | 3/2005 |
| KR | 10-2001-0111520 | 12/2001 |
| KR | 10-2006-0023673 | 3/2006 |

OTHER PUBLICATIONS

Notice of Allowance issued Nov. 17, 2009 in U.S. Appl. No. 11/755,412.
Non-Final Office Action issued Aug. 20, 2009 in U.S. Appl. No. 11/755,412.

*Primary Examiner* — Vip Patel
(74) *Attorney, Agent, or Firm* — H.C. Park & Associates, PLC

(57) ABSTRACT

A display device includes an insulating substrate having an upper surface and a lower surface opposing the upper surface, a display element including a first electrode, an organic light emitting layer on the first electrode, and a second electrode on the organic light emitting layer, a first film connected to a first side of the upper surface, and a first circuit substrate connected to the first film and including a first surface facing the display element, a second surface opposing the first surface, and an electric element protruding from the second surface.

18 Claims, 16 Drawing Sheets

DISPLAY DEVICE

CROSS-REFERENCE TO RELATED APPLICATIONS

This application is a continuation of U.S. patent application Ser. No. 11/755,412, filed May 30, 2007, and claims priority from and the benefit of Korean Patent Application No. 2006-0049548, filed on Jun. 1, 2006, which is hereby incorporated by reference for all purposes as if fully set forth herein.

BACKGROUND OF THE INVENTION

1. Field of the Invention

The present invention relates to a display device.

2. Discussion of the Background

Recently, the organic light emitting diode (OLED) device has attracted attention and interest in the industry of flat panel display devices because of its low-power requirements, light weight, slim shape, wide viewing angle, high-speed response, and the like.

An OLED device includes an insulating substrate, a display element formed on the insulating substrate, and a circuit substrate connected to the insulating substrate. The circuit substrate overlaps with the insulating substrate, thereby decreasing the size of the OLED device. The circuit substrate provides signals such as a driving signal, a driving voltage, and a common voltage to the display element and includes an electric element such as a resistor that protrudes from the circuit substrate. However, the electric element protruding on the circuit substrate may contact other elements thereby causing a malfunction in the OLED device.

Furthermore, the OLED device may use a plurality of circuit substrates. The circuit substrates overlap with the insulating substrate so as to decrease the size of the OLED device. However, the circuit substrates may contact each other, thereby generating an electric defect in the circuit substrate.

SUMMARY OF THE INVENTION

The present invention provides a display device that may reduce the problem due to an electric element protruding from a circuit substrate.

The present invention also provides a display device that may reduce a defect due to contact between circuit substrates.

Additional features of the invention will be set forth in the description which follows, and in part will be apparent from the description, or may be learned by practice of the invention.

The present invention are discloses a display device including a substrate having an upper surface and a lower surface opposing the upper surface; a display element arranged on the upper surface including a first electrode, a light emitting layer on the first electrode, and a second electrode on the light emitting layer; a first film connected to a first side of the upper surface; and a first circuit substrate connected to the first film and including a first surface facing the display element, a second surface opposing the first surface, and an electric element protruding from the second surface.

The present invention also discloses a display device including a substrate having an upper surface and a lower surface opposing the upper surface; a display element arranged on the upper surface and including a first electrode, a light emitting layer on the first electrode, and a second electrode on the light emitting layer; a first film connected to a first side of the upper surface; a first circuit substrate connected to the first film and facing the substrate; a second film connected to a second side of the upper surface; a second circuit substrate connected to the second film and at least partially overlapping with the first circuit substrate; and an insulating member arranged between the first circuit substrate and the second circuit substrate, and the insulating member preventing the first circuit substrate and the second circuit substrate from directly contacting each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
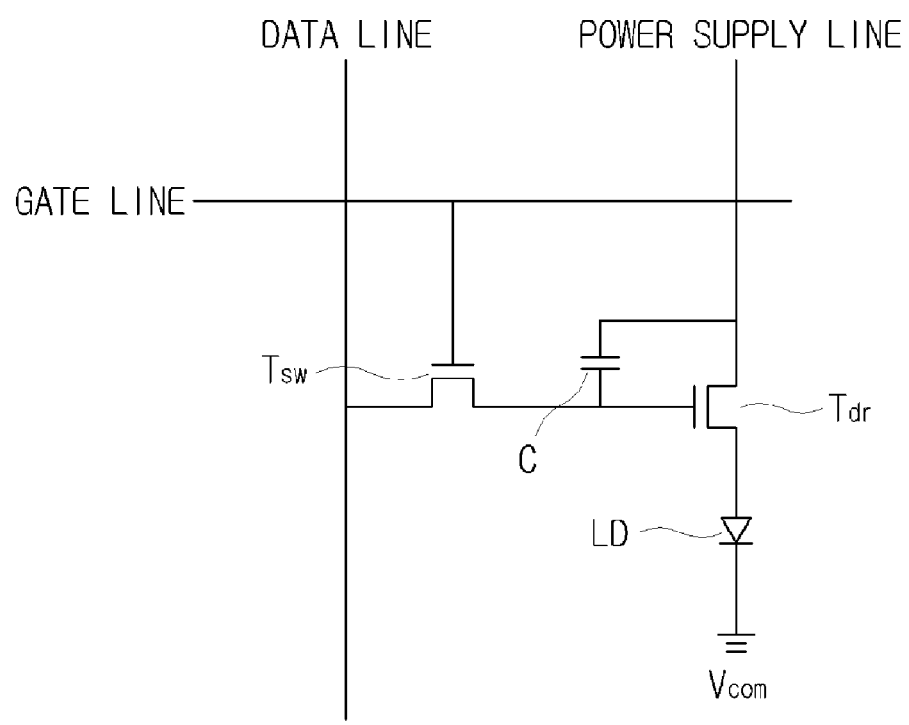
FIG. 1 is an equivalent circuit diagram of a display device according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is an equivalent circuit diagram of a pixel in a display device according to a first exemplary embodiment of the present invention.

As shown in FIG. 1, a pixel includes a plurality of signal lines. The signal lines include a gate line to transmit a scanning signal, a data line to transmit a data signal, and a power supply line to transmit a driving voltage. The data line and the power supply line are disposed adjacent and parallel to each other. The gate line extends substantially perpendicular to the data line and the power supply line.

Each pixel includes an organic light emitting element LD, a switching thin film transistor Tsw, a driving thin film transistor Tdr, and a capacitor C.

The driving thin film transistor Tdr includes a control terminal, an input terminal, and an output terminal. The control terminal is connected to the switching thin film transistor Tsw, the input terminal is connected to the power supply line, and the output terminal is connected to the organic light emitting element LD.

The organic light emitting element LD includes an anode connected to the output terminal of the driving thin film transistor Tdr and a cathode connected to the common voltage Vcom. The organic light emitting element LD emits light with variable intensity depending on an output current from the driving thin film transistor Tdr, thereby displaying images. The intensity of the current from the driving thin film transistor Tdr varies depending on a voltage between its control terminal and output terminal.

The switching thin film transistor Tsw includes a control terminal, an input terminal and an output terminal. The control terminal is connected to the gate line, the input terminal is connected to the data line, and the output terminal is connected to the control terminal of the driving thin film transistor Tdr. The switching thin film transistor Tsw transmits the data signal from the data line to the driving thin film transistor Tdr according to the scanning signal applied to the gate line.

The capacitor C is connected between the control and input terminals of the driving thin film transistor Tdr. The capacitor C may be charged with the data signal input to the control terminal of the driving thin film transistor Tdr and maintain it.

A display device according to the first exemplary embodiment will be described below with reference to FIG. 2, FIG. 3, FIG. 4, FIG. 5, FIG. 6, FIG. 7, FIG. 8, and FIG. 9.

Figure 2:
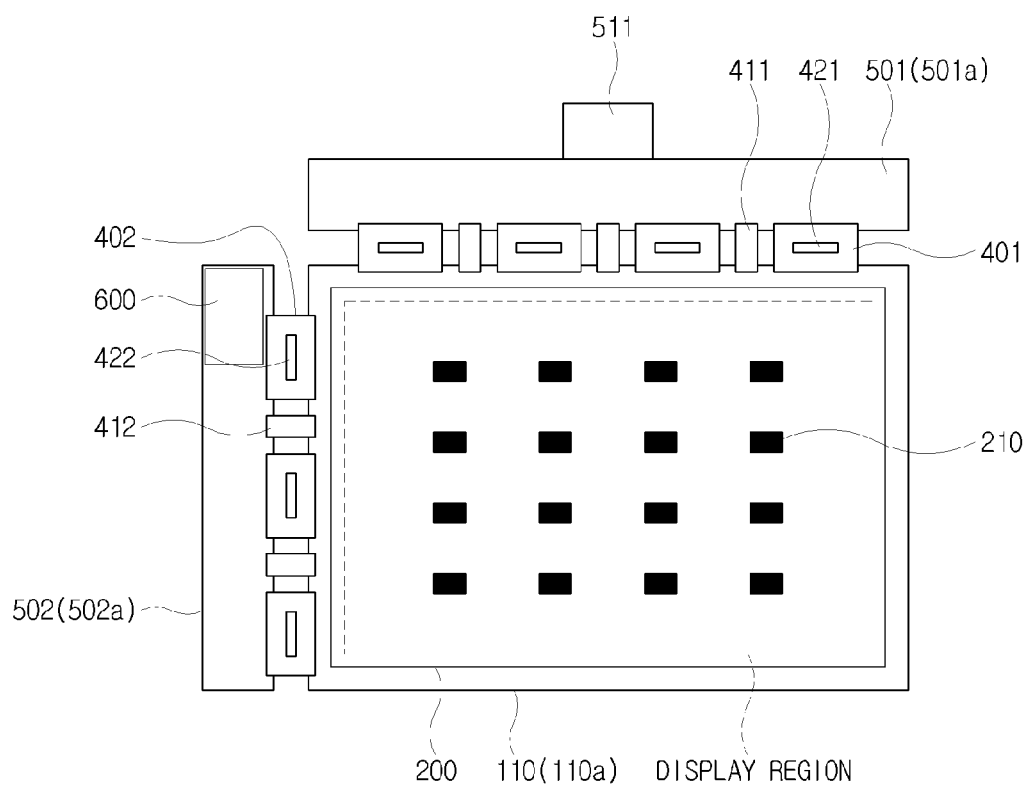
FIG. 2 is a front plan view of the display device in an unfolded state according to the first exemplary embodiment of the present invention.
Figure 3:
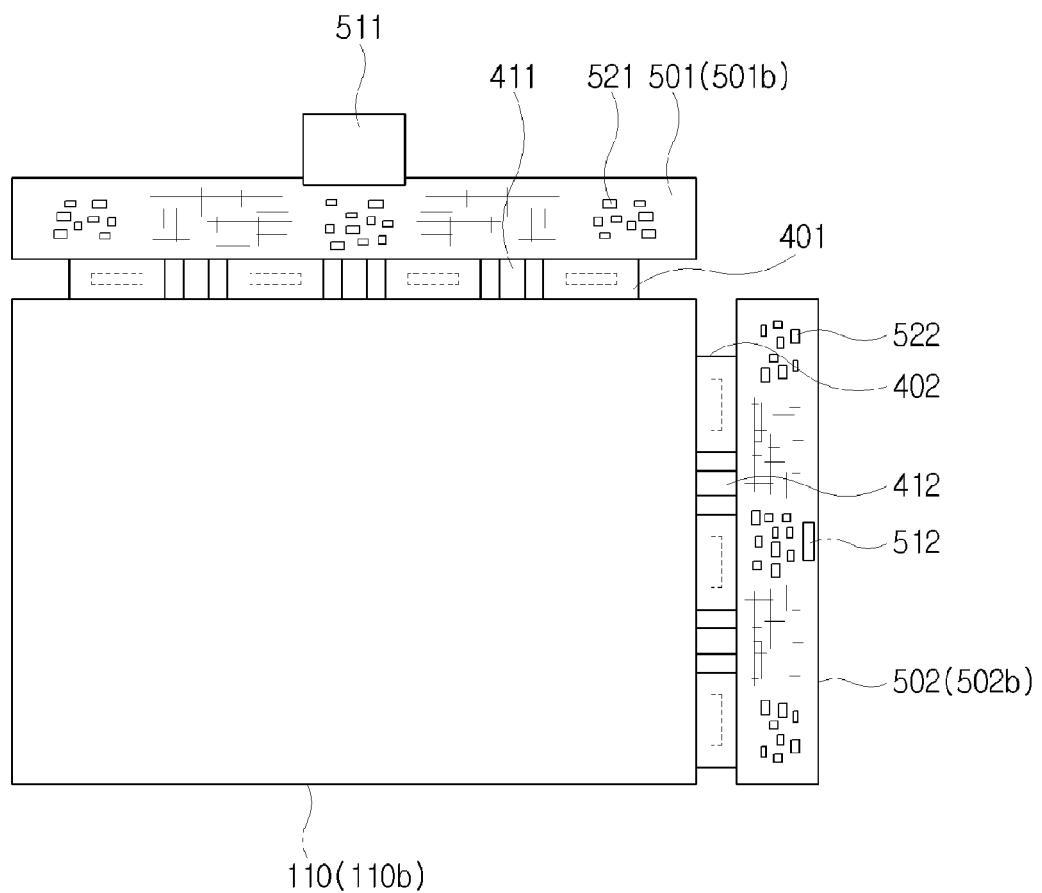
FIG. 3 is a rear plan view of the display device in an unfolded state according to the first exemplary embodiment of the present invention.
Figure 4:
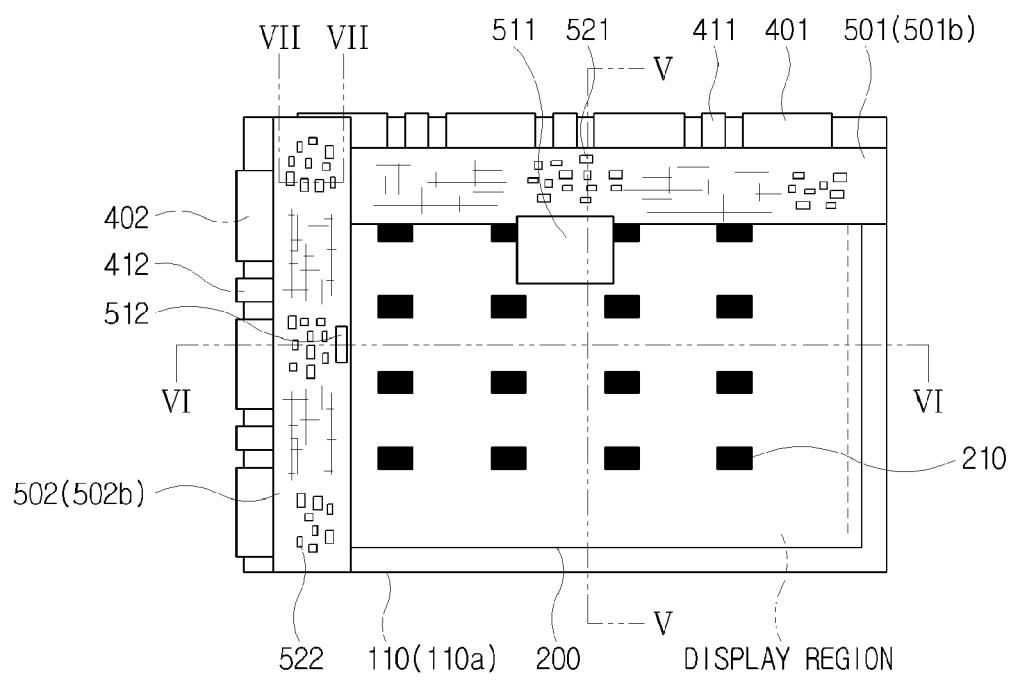
FIG. 4 is a plan view of the display device according to the first exemplary embodiment of the present invention.

FIG. 2 is a front plan view of the display device in an unfolded state according to the first exemplary embodiment of the present invention; FIG. 3 is a rear plan view of the display device in an unfolded state according to the first exemplary embodiment of the present invention; FIG. 4 is a plan view of the display device in a folded state according to the first exemplary embodiment of the present invention; FIG.

Figure 5:
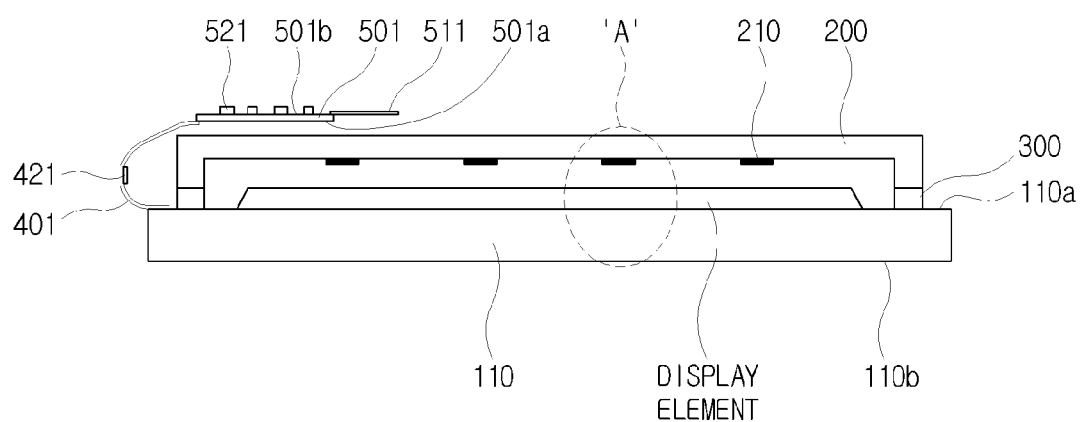
FIG. 5 is a sectional view of the display device, taken along line V-V in FIG. 4.
Figure 6:
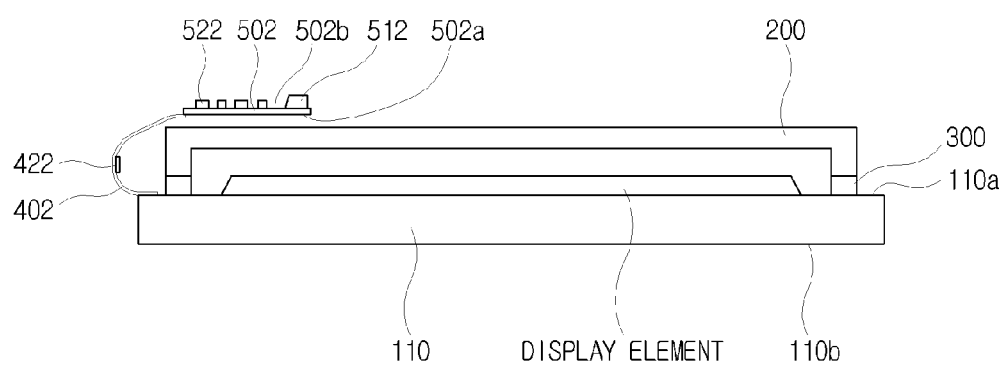
FIG. 6 is a sectional view of the display device, taken along line VI-VI in FIG. 4.
Figure 7:
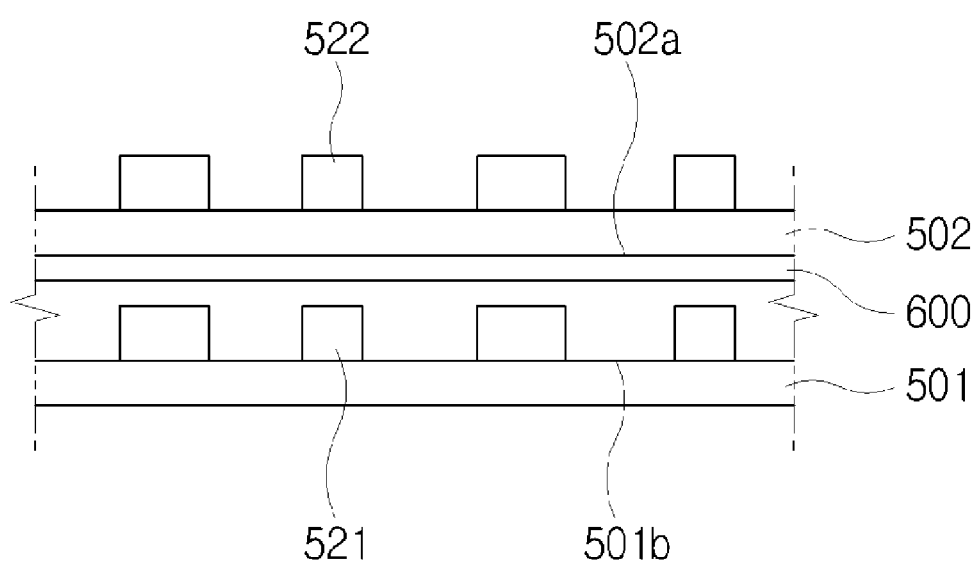
FIG. 7 is a sectional view of the display device, taken along line VII-VII in FIG. 4.
Figure 8:
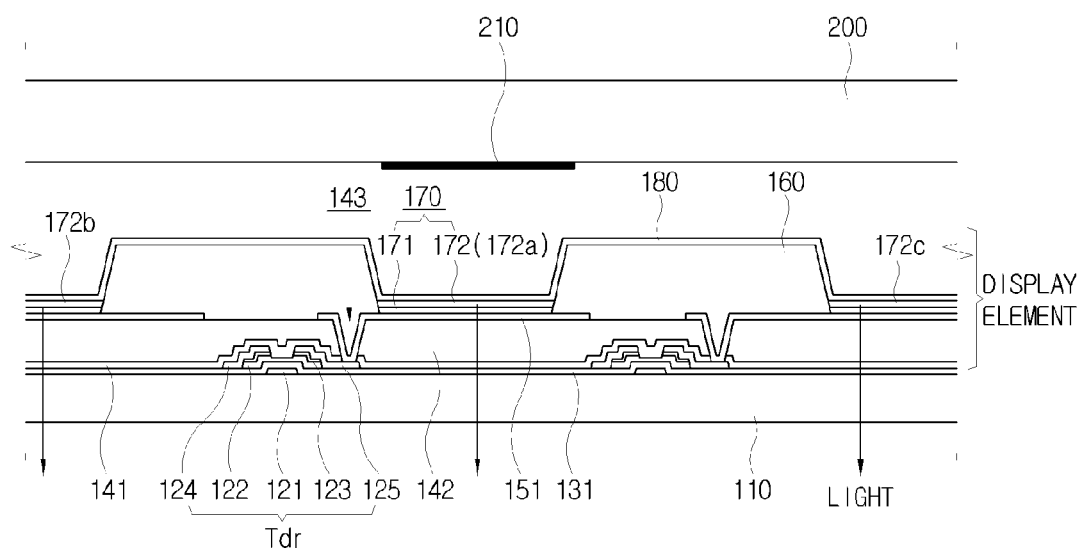
FIG. 8 is an enlarged view of an area 'A' in FIG. 5.
Figure 9:
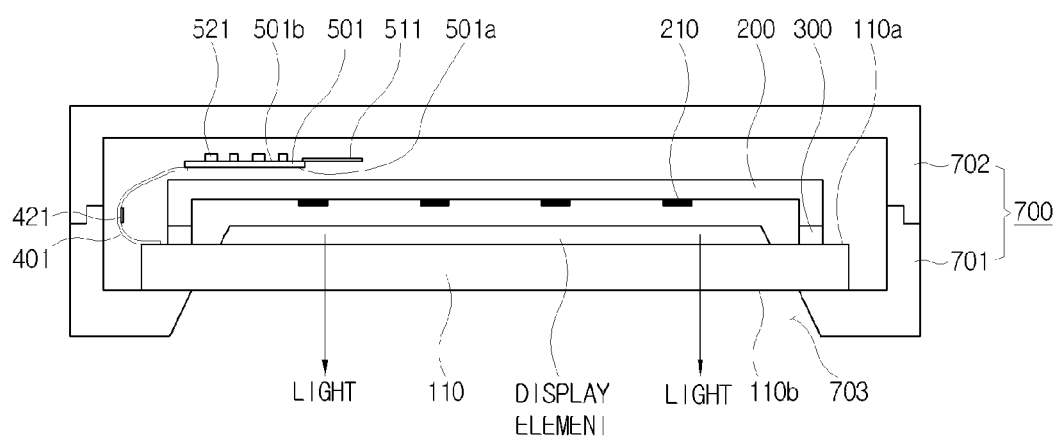
FIG. 9 is a sectional view of a display device including a casing according to the first exemplary embodiment of the present invention.

5 is a sectional view of the display device, taken along line V-V in FIG. 4; FIG. 6 is a sectional view of the display device, taken along line VI-VI in FIG. 4; FIG. 7 is a sectional view of the display device, taken along line VII-VII in FIG. 4; FIG. 8 is an enlarged view of area 'A' in FIG. 5; and FIG. 9 is a sectional view of the display device in a casing according to the first exemplary embodiment of the present invention. FIG. 2, FIG. 3, FIG. 4, FIG. 5, FIG. 6, FIG. 7, and FIG. 8 show the display device without the casing, but FIG. 9 shows the display device accommodated in the casing.

A display device according to the first exemplary embodiment may include an insulating substrate 110, a display element formed on the insulating substrate 110, and an encapsulation substrate 200 combined with the insulating substrate 110 and covering the display element. A moisture absorbent 210 is provided on an inner surface of the encapsulation substrate 200 to protect the display element from moisture.

First, elements connected to the insulating substrate 110 will be described with reference to FIG. 2 and FIG. 3. In the following description, 'a left side' and 'a right side' of the display device are based on FIG. 2.

The insulating substrate 110 may be made of an insulating material such as glass, quartz, ceramic, or plastic. The insulating substrate 110 includes an upper surface 110a, where a display element is formed, and a lower surface 110b opposing the upper surface 110a.

A first film 401 and a power supply transmitting film 411 are provided in a non-display region above a display region. First sides of the first film 401 and the power supply transmitting film 411 are connected to the upper surface 110a, and second sides thereof are connected to a first circuit substrate 501. The first film 401 transmits a data driving signal to the display element, and the power supply transmitting film 411 transmits a driving voltage to the display element.

The first film 401 and the power supply transmitting film 411 may be connected to the insulating substrate 110 and the first circuit substrate 501 using an anisotropic conductive film (not shown).

A driving chip 421 is disposed on the first film 401. The first film 401 may be flexible. Wire (not shown) may be formed on the first film 401 to connect the driving chip 421 with the display element and the first circuit substrate 501.

The first circuit substrate 501 receives power and driving signals and suitably converts them to be supplied to the display element. The first circuit substrate 501 comprises a first surface 501a and a second surface 501b opposing the first surface 501a. As shown in FIG. 2 and FIG. 3, the first surface 501a and the upper surface 110a face the same direction, and the second surface 501b and the lower surface 110b face the same direction.

Electric elements 521 are formed on the first circuit substrate 501 to convert the power and the driving signals. The electric elements 521 may include a resistor, a capacitor, and the like. The electric elements 521 protrude from the first circuit substrate 501. In the first exemplary embodiment, the electric elements 521 are disposed on the second surface 501b. Thus, the first surface 501a may be substantially flat because the electric elements 521 are not disposed on it.

A first side of the first circuit substrate 501 is connected to the first film 401 and the power supply transmitting film 411, and a second side thereof is connected to an external connector 511.

A second film 402 and a common voltage transmitting film 412 are provided on the upper surface 110a in the non-display region on the left side of the display region. First sides of the second film 402 and the common voltage transmitting film 412 are connected to the upper surface 110a, and second sides thereof are connected to a second circuit substrate 502. The second film 402 transmits a gate driving signal to the display element, and the common voltage transmitting film 412 transmits a common voltage to the display element.

The second film 402 and the common voltage transmitting film 412 may be connected to the insulating substrate 110 and the second circuit substrate 502 using an anisotropic conductive film (not shown).

A driving chip 422 is formed on the second film 402. The second film 402 may be flexible. Wire (not shown) may be formed on the second film 402 to connect the driving chip 422 with the display element and the second circuit substrate 502.

The second circuit substrate 502 receives power and driving signals and suitably converts them to be supplied to the display element. The second circuit substrate 502 includes a first surface 502a and a second surface 502b opposing the first surface 501a. As shown in FIG. 2 and FIG. 3, the first surface 502a and the upper surface 110a face the same direction, and the second surface 502b and the lower surface 110b face the same direction.

Electric elements 522 are formed on the second circuit substrate 502 to convert the power and driving signals. The electric elements 522 may include a resistor, a capacitor, and the like. The electric elements 522 protrude from the second circuit substrate 502. In the first exemplary embodiment, the electric elements 522 are disposed on the second surface 502b. A connector 512 to be connected to an external element is disposed on the second surface 502b as well. Thus, the first surface 502a may be substantially flat where the electric elements 522 and the connector 512 are not disposed on it.

An insulating tape 600 is provided on an upper portion of the first surface 502a of the second circuit substrate 502. The insulating tape 600 may prevent electrical interference between the first circuit substrate 501 and the second circuit substrate 502, which will be described later in detail.

As FIG. 2, shows, no elements need be connected to the lower side and right side of the display region.

In the display device, the circuit substrates 501 and 502 overlap with the insulating substrate 110, thereby decreasing the size of the display device. Referring to FIG. 4 FIG. 5, FIG. 6, and FIG. 7, a folded state in which the circuit substrates 501 and 502 overlap with the insulating substrate 110 will be described.

The first surface 501a of the circuit substrate 501 is disposed to face the upper surface 110a. The first film 401 and the power supply transmitting film 411 bend so that the first surface 501a faces the upper surface 110a. The display element and the encapsulation substrate 200 are disposed between the first circuit substrate 501 and the insulating substrate 110. The first surface 501a faces the encapsulation substrate 200 directly as shown in FIG. 5. As the first surface 501a may be substantially flat, the first circuit substrate 501 may suffer less damage even though it directly contacts the encapsulation substrate 200. Thus, the first circuit substrate 501 may operate properly. Further, because the first circuit substrate 501 can be disposed close to the encapsulation substrate 200, the display device may be thinner.

The first surface 502a of the second circuit substrate 502 is disposed to face the upper surface 110a. The display element and the encapsulation substrate 200 are disposed between the second circuit substrate 502 and the insulating substrate 110. The first surface 502a directly contacts the encapsulation substrate 200 as shown in FIG. 6 or may be arranged close to the encapsulation substrate 200. As the first surface 502a is substantially flat, the second circuit substrate 502 may suffer less damage even through it directly contacts the encapsulation substrate 200. Thus, the second circuit substrate 502 may operate properly. Further, because the second circuit substrate 502 can be disposed close to the encapsulation substrate 200, the display device may be thinner.

The first circuit substrate 501 and the second circuit substrate 502 extend lengthwise and partially overlap with each other and overlap with the insulating substrate 110. That is, a left portion of the first circuit substrate 501 and an upper portion of the second circuit substrate 502 overlap with each other. Here, the second circuit substrate 502 is disposed on the first circuit substrate 501, and thus the second surface 501b of the first circuit substrate 501 faces the first surface 502a of the second circuit substrate 502 in the overlapping area.

When the first circuit substrate 501 and the second circuit substrate 502 contact each other, a short circuit may be generated therebetween. Thus, the circuit substrates 501 and 502 may become defective. In the first exemplary embodiment, the insulating tape 600 is provided in the overlapping area of the circuit substrates 501 and 502 to prevent the circuit substrates 501 and 502 from short-circuiting each other.

Alternatively, the insulating tape 600 may be provided on portions of both circuit substrates 501 and 502 or across the circuit substrates 501 and 502. Also, an insulating layer may be formed on the circuit substrates 501 and 502 instead, or an insulating member may be used, which is not combined with the circuit substrates 501 and 502.

The encapsulation substrate 200 may be made of glass, aluminum or the like and is coupled with the insulating substrate 110 by a sealant 300.

As described above, the circuit substrates 501 and 502 are disposed on the display element, considering that the display device is a bottom-emission type in which the display element emits light toward the insulating substrate 110. In other words, the circuit substrates 501 and 502 are disposed where light is not emitted.

A configuration of the display element will be described with reference to FIG. 8. FIG. 8 shows a driving thin film transistor Tdr without a switching thin film transistor Tsw.

A gate electrode 121 is formed on the insulating substrate 110. A gate insulating layer 131, which may be made of silicon nitride (SiNx), is formed on the insulating substrate 110 and the gate electrode 121. A semiconductor layer 122 and an ohmic contact layer 123 are sequentially formed on the gate insulating layer 131 where the gate electrode 121 is disposed. The semiconductor layer 122 may be made of amorphous silicon, and the ohmic contact layer 123 may be made of n+ hydrogenated amorphous silicon that is highly doped with n-type impurities. The ohmic contact layer 123 is divided into two parts, and the gate electrode 121 is disposed therebetween.

A source electrode 124 and the drain electrode 125 are formed on the ohmic contact layer 123 and the gate insulating layer 131. The source electrode 124 and the drain electrode 125 are spaced apart from each other, and the gate electrode 121 is disposed therebetween.

A passivation layer 141 is formed on the source electrode 124, the drain electrode 125, and the semiconductor layer 122 exposed between the source and drain electrodes 124 and 125. The passivation layer 141 may be made of silicon nitride (SiNx).

A flattening layer 142 is formed on the passivation layer 141 and may be made of an organic material. The flattening layer 142 comprises may include benzocyclobutene (BCB), olefin, acrylic resin, polyimde, tefron, cytop, and perfluorocyclobutene (FCB).

A contact hole 143 is formed in the flattening layer 142 and the passivation layer 141 to expose the drain electrode 125.

A pixel electrode 151 is formed on the flattening layer 142. The pixel electrode 151 may provide holes to a light emitting layer 172. The pixel electrode 151 may be made of a transparent conductive material such as indium tin oxide (ITO) or indium zinc oxide (IZO), and it may be formed by sputtering. The pixel electrode 151 may be patterned in a nearly rectangular shape.

A wall 160 is formed between the pixel electrodes 151 to define a pixel region. The wall 160 prevents the source electrode 124 and the drain electrode 125 from short-circuiting with a common electrode 180. The wall 160 may be made of a photoresist material with thermal resistance and solvent resistance such as acrylic resin, or polyimide resin.

An organic layer 170 is formed on the pixel electrode 151. The organic layer 170 may include a hole injecting layer 171 and a light emitting layer 172.

The hole injecting layer 171 may include a mixture of poly thiophene derivatives such as poly-3,4-ethylenedioxythiophene (PEDOT) or the like and poly styrenesulfonate (PSS) or the like.

The light emitting layer 172 may include a red light emitting layer 172a, a green light emitting layer 172b, and a blue light emitting layer 172c.

The light emitting layer 172 may include polyfluorene derivatives, poly(p-phenylene vinylene) derivatives, polyphenylene derivatives, poly(N-vinylcarbazole) derivatives and poly thiophene derivatives; or compounds thereof doped with a perillene group pigment, rhodamine, rubrene, perillene, 9,10-diphenylanthracene, tetraphenylbuta, tetraphenylbutadiene, Nile red, cumarine 6, quinacridone, and the like.

Holes provided from the pixel electrode 151 and electrons provided from the common electrode 180 which combine with each other in the light emitting layer 172 to become excitons and generate light while inactivated.

The common electrode 180 is formed on the wall 160 and the light emitting layer 172. The common electrode 180 provides electrons to the light emitting layer 172. The common electrode 180 may include a double layer of a lithium fluoride layer and an aluminum layer. When the common electrode 180 is made of an opaque material such as aluminum, silver, or the like, light emitted from the light emitting layer 172 exits toward the insulating substrate 110. In this case, the display device is a bottom-emission type.

In the aforementioned display element, the organic layer 170 is made of a polymer. Alternatively, the organic layer 170 may be made of a low molecular weight material by thermal evaporation. The light emitting layer 172 may provide white light, and in this case, a color filter may be disposed between the insulating substrate 110 and the light emitting layer 172.

The display device comprises a casing 700. As shown in FIG. 9, the casing 700 comprises an upper casing 701 and a lower casing 702. The upper casing 701 has an opening 703 to correspond to the display region. The lower surface 110b of the insulating substrate 110 is exposed through the opening 703. Images are displayed on the lower surface 110b.

Figure 10:
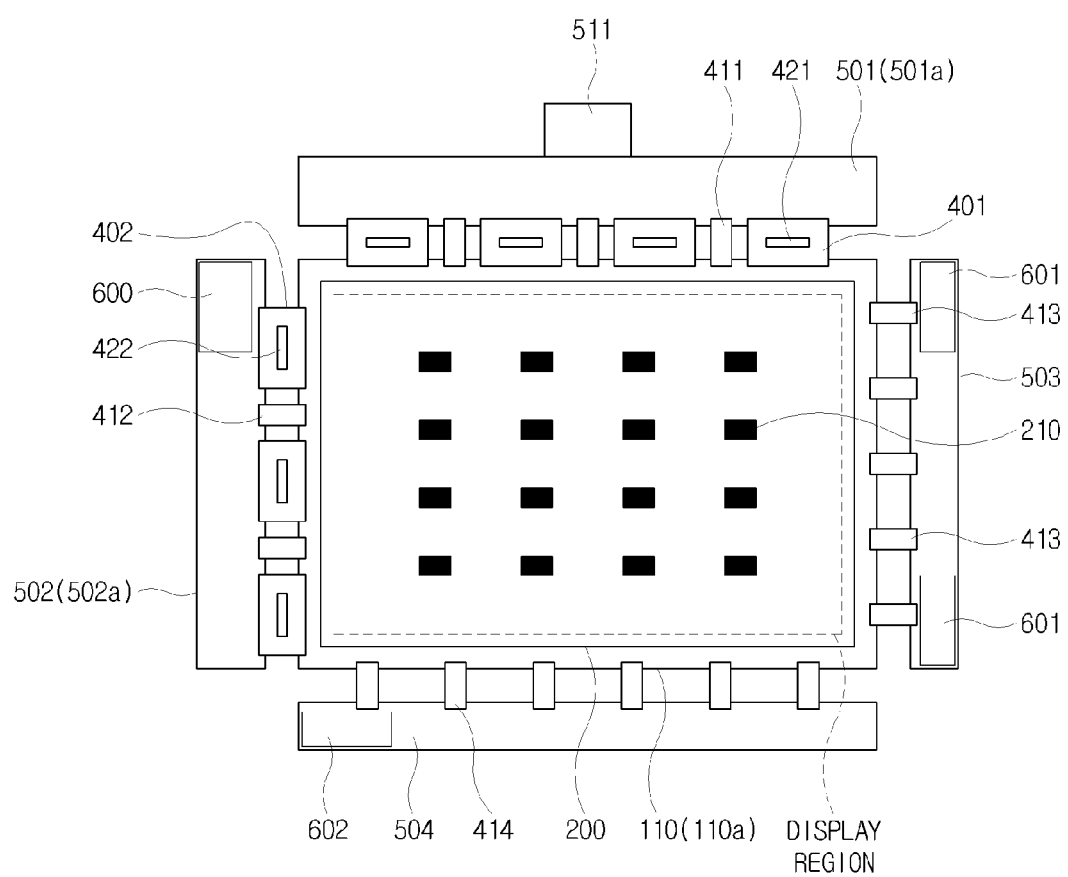
FIG. 10 is a front plan view of a display device in an unfolded state according to a second exemplary embodiment of the present invention.

FIG. 10 is a front plan view of a display device in an unfolded state according to a second exemplary embodiment of the present invention. A common voltage transmitting film 413 and a third circuit substrate 503 are provided in a non-display region on the right side of a display region. The third circuit substrate 503 receives a common voltage from the outside and supplies it to a display element through the common voltage transmitting film 413. The common voltage transmitting film 413 and the third circuit substrate 503 may maintain the common voltage substantially constant in the display element. An insulating tape 601 is provided at an upper portion and a lower portion of the third circuit substrate 503.

A power supply transmitting film 414 and a fourth circuit substrate 504 are provided in the non-display region below the display region. The fourth circuit substrate 504 receives a driving voltage to transmit it to the display element through the power supply transmitting film 414. The power supply transmitting film 414 and the fourth circuit substrate 504 may maintain the driving voltage substantially constant in the display element. An insulating tape 602 is provided at the left portion of the fourth circuit substrate 504.

Electric elements are not formed on the third circuit substrate 503 and the fourth circuit substrate 504. The first circuit substrate 501 and the second circuit substrate 502 have the same configuration as in the first exemplary embodiment.

In the second exemplary embodiment, the circuit substrates 501, 502, 503 and 504 are disposed to face an upper surface 110a. The common voltage transmitting film 413 and the power supply transmitting film 414 bend. Here, the circuit substrates are bent in the order of the first circuit substrate 501, the second circuit substrate 502, the fourth circuit substrate 504, and the third circuit substrate 503. The insulating tape 602 prevents the second circuit substrate 502 from directly contacting the fourth circuit substrate 504. The insulating tape 601 prevents the third circuit substrate 503 from directly contacting the first circuit substrate 501 and the fourth circuit substrate 504.

Figure 11:
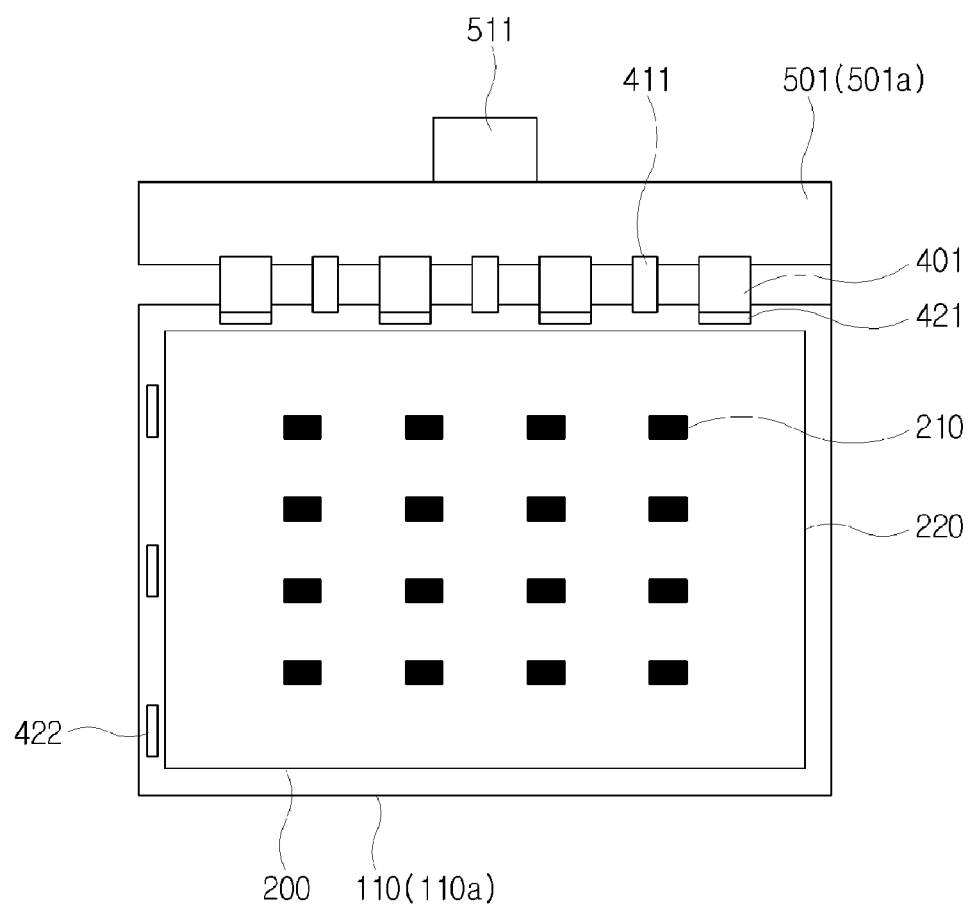
FIG. 11 is a front plan view of a display device in an unfolded state according to a third exemplary embodiment of the present invention.
Figure 12:
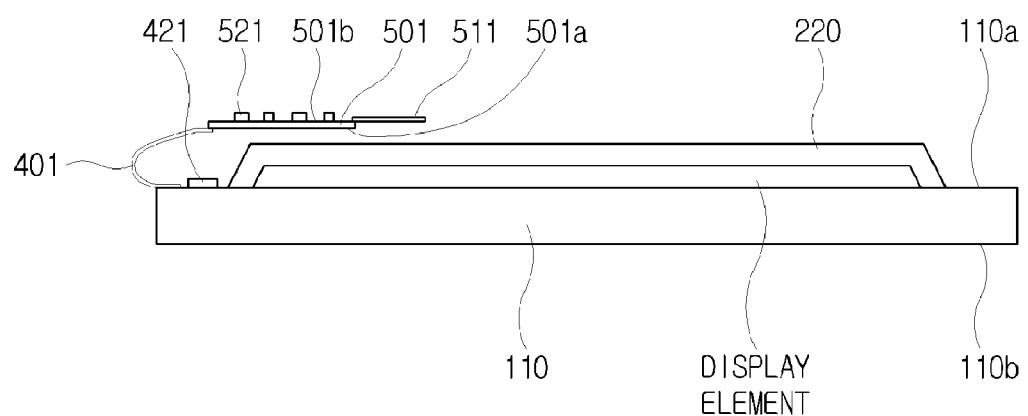
FIG. 12 is a sectional view of the display device according to the third exemplary embodiment of the present invention.

FIG. 11 is a front plan view of a display device in an unfolded state according to a third exemplary embodiment of the present invention, and FIG. 12 is a sectional view of the display device according to the third exemplary embodiment of the present invention.

Contrary to the first exemplary embodiment, driving chips 421 and 422 are directly mounted on an upper surface 110a of an insulating substrate 110 in the third exemplary embodiment. Further, a circuit substrate is not provided to apply a gate driving signal. Wire (not shown) may be formed on the upper surface 110a to transmit the gate driving signal and a common voltage to the driving chip 422.

A first circuit substrate 501 has the same configuration as in the first exemplary embodiment and is disposed to face the upper surface 110a.

A display element is covered with an encapsulation layer 220. The encapsulation layer 220 may prevent moisture or oxygen from infiltrating the display element, and it may be made of an inorganic layer and/or an organic layer. A first surface 501a of the first circuit substrate 501 faces the encapsulation layer 220 as in FIG. 12.

Figure 13:
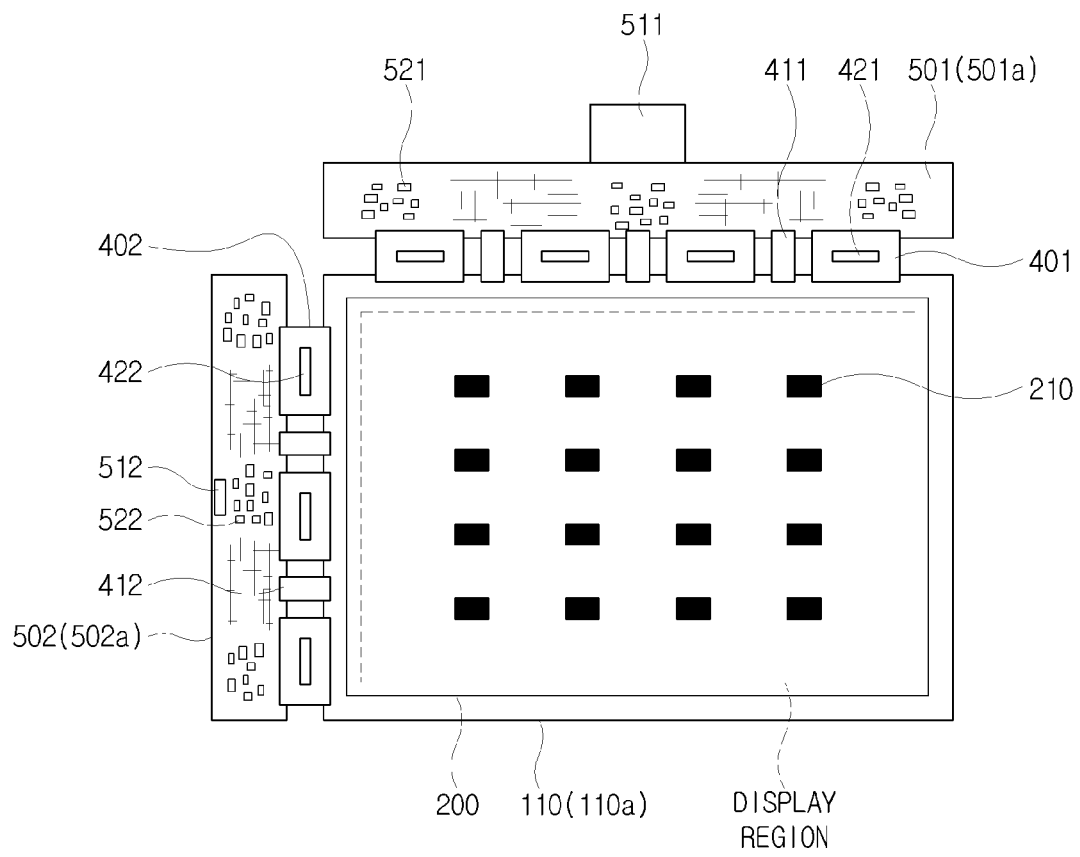
FIG. 13 is a front plan view of a display device in an unfolded state according to a fourth exemplary embodiment of the present invention.
Figure 14:
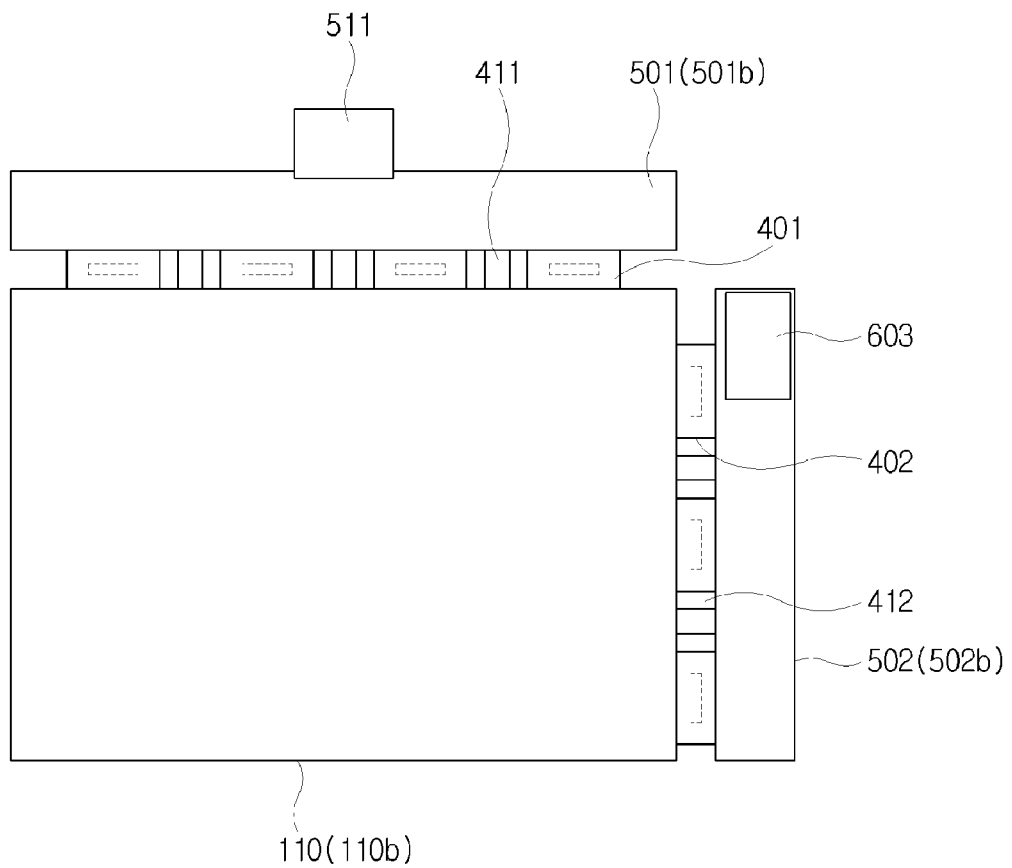
FIG. 14 is a rear plan view of the display device in an unfolded state according to the fourth exemplary embodiment of the present invention.
Figure 15:
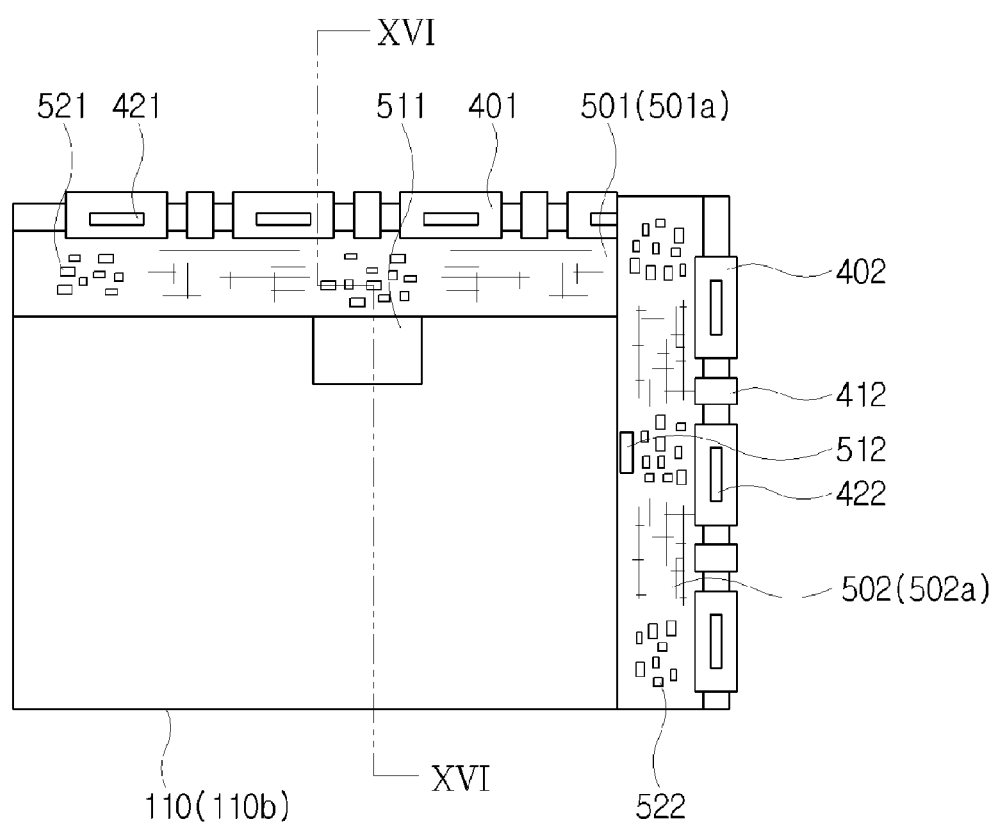
FIG. 15 is a plan view of the display device according to the fourth exemplary embodiment of the present invention.
Figure 16:
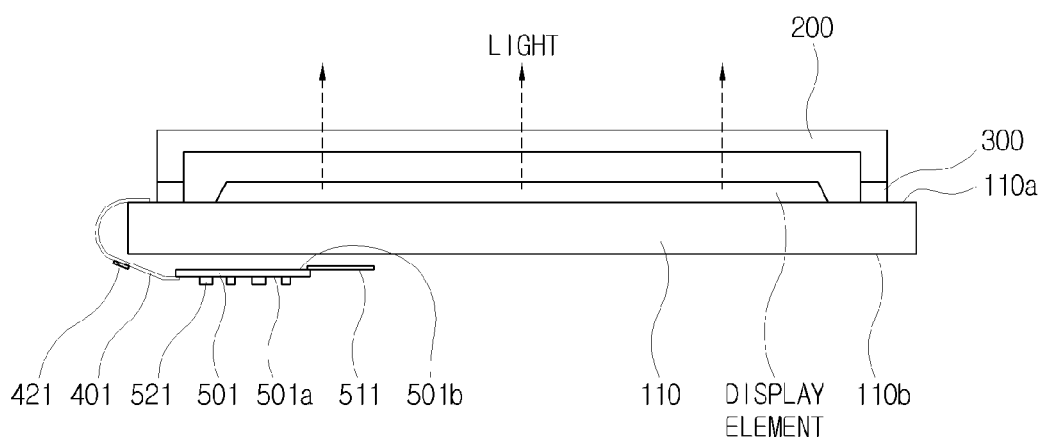
FIG. 16 is a sectional view of the display device, taken along line XVI-XVI in FIG. 15.

A display device according to a fourth exemplary embodiment of the present invention will be described with reference to FIG. 13, FIG. 14, FIG. 15, and FIG. 16. FIG. 13 is a front plan view of the display device in an unfolded state according to the fourth exemplary embodiment of the present invention, FIG. 14 is a rear plan view of the display device in an unfolded state according to the fourth exemplary embodiment of the present invention, FIG. 15 is a plan view of the display device in a folded state according to the fourth exemplary embodiment of the present invention, and FIG. 16 is a sectional view of the display device, taken along line XVI-XVI in FIG. 15.

In the fourth exemplary embodiment, electric elements 521 and 522 are formed on first surfaces 501a and 502a of each circuit substrate, respectively. A connector 512 of a second circuit substrate 502 is formed on the first surface 502a as well. Thus, second surfaces 501b and 502b of the circuit substrates 501 and 502 may be substantially flat.

An insulating tape 603 is provided at an upper portion of the second surface 502b of the second circuit substrate 502.

Contrary to the first exemplary embodiment, the circuit substrates 501 and 502 are disposed to face a lower surface 110b of an insulating substrate 110, since the display device is a top-emission type that emits light toward an encapsulation substrate 200. In the display element which is shown in FIG. 8, a pixel electrode 151 may be made of a reflective metal, and a common electrode 180 may be made of a transparent material. Here, the common electrode 180 may include an alloy of magnesium and silver or an alloy of calcium and silver, and it may be about 50 nm and to 200 nm thick. If the common electrode 180 is less than 50 nm thick, resistance may become excessively high so that a common voltage may not be efficiently applied. On the other hand, if the common electrode 180 is more than 200 nm thick, it may become opaque.

The second surfaces 501b and 502b of the circuit substrates 501 and 502, where the electric elements 521 and 522 are not formed, directly faces the insulating substrate 110. Thus, a defect may be prevented in the circuit substrates 501 and 502 even though they directly contact the insulating substrate 110. Further, the circuit substrates 501 and 502 may be disposed close to the insulating substrate 110, thereby decreasing the thickness of the display device.

As described above, the present invention provides a display device in which that may prevent the problem due to an electric element protruding from a circuit substrate.

Further, the present invention provides a display device that may reduce a defect due to contact between circuit substrates.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
a substrate;
a first electrode disposed on the substrate;
a light emitting layer on the first electrode
a second electrode on the light emitting layer;
a first film connected to the substrate;
a first circuit substrate connected to the first film and comprising a first surface facing the light emitting layer, a second surface opposing the first surface, and an electric element disposed on the second surface; and
an encapsulation member disposed between the light emitting layer and the first circuit substrate.

2. The display device of claim 1, wherein the second electrode comprises an opaque material.

3. The display device of claim 2, wherein the first electrode comprises a transparent material.

4. The display device of claim 3, wherein the encapsulation member is disposed within an outer boundary of the substrate.

5. The display device of claim 4, wherein first circuit substrate is disposed on the second electrode.

6. The display device of claim 5, further comprising:
a second film connected to the substrate;
a second circuit substrate connected to the second film and at least partially overlapping the first circuit substrate; and
an insulating member arranged on at least one of the first circuit substrate and the second circuit substrate.

7. The display device of claim 1, wherein the first electrode comprises a transparent material.

8. The display device of claim 7, wherein the encapsulation member is disposed within an outer boundary of the substrate.

9. The display device of claim 8, wherein first circuit substrate is disposed on the second electrode.

10. The display device of claim 9, further comprising:
a second film connected to the substrate;
a second circuit substrate connected to the second film and at least partially overlapping the first circuit substrate; and
an insulating member arranged on at least one of the first circuit substrate and the second circuit substrate.

11. The display device of claim 1, wherein the encapsulation member is disposed within an outer boundary of the substrate.

12. The display device of claim 11, wherein first circuit substrate is disposed on the second electrode.

13. The display device of claim 12, further comprising:
a second film connected to the substrate;
a second circuit substrate connected to the second film and at least partially overlapping the first circuit substrate; and
an insulating member arranged on at least one of the first circuit substrate and the second circuit substrate.

14. The display device of claim 1, wherein first circuit substrate is disposed on the second electrode.

15. The display device of claim 14, further comprising:
a second film connected to the substrate;
a second circuit substrate connected to the second film and at least partially overlapping the first circuit substrate; and
an insulating member arranged on at least one of the first circuit substrate and the second circuit substrate.

16. The display device of claim 1, further comprising:
a second film connected to the substrate;
a second circuit substrate connected to the second film and at least partially overlapping the first circuit substrate; and
an insulating member arranged on at least one of the first circuit substrate and the second circuit substrate.

17. The display device of claim 16, wherein the first film is connected to a first edge of the substrate only.

18. The display device of claim 17, wherein the second film is connected to a second edge of the substrate only, and wherein the second edge is perpendicular to the first edge.

* * * * *